(12) United States Patent
Mair et al.

(10) Patent No.: US 7,480,352 B2
(45) Date of Patent: Jan. 20, 2009

(54) METHOD OF AN MEANS FOR RECOGNIZING SIGNAL EDGES

(75) Inventors: Werner Mair, Weinitzen (AT); Heinz Lanzenberger, Graz (AT)

(73) Assignee: NXP B.V., Eindhoven (NL)

( * ) Notice: Subject to any disclaimer, the term of this patent is extended or adjusted under 35 U.S.C. 154(b) by 893 days.

(21) Appl. No.: 10/484,422

(22) PCT Filed: Jul. 19, 2002

(86) PCT No.: PCT/IB02/03026

§ 371 (c)(1),
(2), (4) Date: Jan. 20, 2004

(87) PCT Pub. No.: WO03/010934

PCT Pub. Date: Feb. 6, 2003

(65) Prior Publication Data

US 2004/0196765 A1    Oct. 7, 2004

(30) Foreign Application Priority Data

Jul. 20, 2001    (EP) .................................. 01890215

(51) Int. Cl.
*H04L 27/06* (2006.01)

(52) U.S. Cl. ...................................................... 375/340
(58) Field of Classification Search ................. 375/316, 375/340, 377, 259
See application file for complete search history.

(56) References Cited

U.S. PATENT DOCUMENTS

| | | | | |
|---|---|---|---|---|
| 5,121,413 A * | 6/1992 | Voegtly et al. | ............... | 375/342 |
| 5,293,369 A | 3/1994 | Melas et al. | | |
| 5,870,022 A * | 2/1999 | Kuhnly et al. | ............... | 340/567 |
| 5,880,889 A * | 3/1999 | Neumann et al. | ........... | 359/634 |
| 6,020,840 A * | 2/2000 | Ong | ........................... | 341/155 |
| 6,177,898 B1 * | 1/2001 | Ong | ........................... | 341/155 |

* cited by examiner

*Primary Examiner*—Tesfaldet Bocure

(57) ABSTRACT

In the case of a method of detecting a signal edge in a signal with temporally successive signal edges, there are performed, after triggering by an interrupt signal (IS) generated in an analog/digital converter (13), detection of a rise-representing rise value between two detected amplitude values with subsequent assessment of the rise value together with detection of signal edge direction information and signal edge occurrence information. Further use of this signal edge information is dependent on an additionally detected and assessed signal strength value, which signal strength value is formed from a sum of further amplitude values.

8 Claims, 2 Drawing Sheets

METHOD OF AN MEANS FOR RECOGNIZING SIGNAL EDGES

The invention relates to a method of detecting a signal edge in a signal with temporally successive signal edges, in which method the method steps listed below are performed, namely:
a) etection of temporally successive amplitude values of the signal,
b) etection of the presence of a rise between a first detected amplitude value and a second detected amplitude value,
c) etection of signal edge occurrence information representing the time of occurrence of a signal edge.

The invention further relates to a communication station and to signal edge detection means, which are suitable for performing such a method.

Such signal edge detection means, which are suitable for performing a method with the above-mentioned method steps of detecting signal edges in a signal with temporally successive signal edges, are known from patent document U.S. Pat. No. 5,293,369 A, for example. With the known solution, it is already known to sample an analog signal by means of an A/D converter and to generate digital data, which digital data represent a signal amplitude value. It is also already known to ascertain overshooting or undershooting of amplitude values of the signal of the digitized signal in relation to a signal amplitude threshold and to ascertain a signal amplitude threshold overshoot time between two successive amplitude values of the signal, if a first signal amplitude value lies below the signal amplitude threshold and a following second signal amplitude value lies over the signal amplitude threshold. It is also already known from the known solution to assess a rise of an occurring signal edge in relation to a rise threshold. However, the known solution is unfortunately not sufficient to detect signal edges in a signal with temporally successive signal edges when interference pulses additionally occur in the signal and the signal is relatively weak and relatively noisy. Such a signal occurs for example in an RFID system. Something that is particularly difficult in such an RFID system is the detection of the signal edges in a signal with temporally successive signal edges, if a data signal transmission means suitable for performing load modulation, for example a data carrier for contactless communication, is produced by means of a semi-conducting polymer. The reason for this is that, in this case, only limited load modulation may be performed due to the marked scattering of individual components of the data signal transmission means made from a semi-conducting polymer and due to a pronounced ageing effect of the components, which limited load modulation leads ultimately to a relatively small signal, wherein the detection of signal edges can then no longer proceed satisfactorily with the known solution.

It is an object of the invention to eliminate the above-described problems and to provide an improved method and an improved communication station and improved signal edge detection means.

To achieve the above-mentioned object, features according to the invention are provided for a method according to the invention, such that a method according to the invention may be characterized in the following way, namely:

A method of detecting a signal edge in a signal with temporally successive signal edges, in which method the method steps listed below are performed, namely:
a) etection of temporally successive amplitude values of the signal,
b) etection of the presence of a rise between a first detected amplitude value and a second detected amplitude value,
c) etection of signal edge occurrence information representing the time of occurrence of a signal edge,
d) etection of a signal strength value by means of at least one of the detected amplitude values,
e) assessment of the detected signal strength value in relation to a signal strength reference value.

To achieve the above-mentioned object, features according to the invention are provided for a communication station according to the invention, so that a communication station according to the invention may be characterized in the following way, namely:

A communication station with signal edge detection means for detecting a signal edge in a signal with temporally successive signal edges, which signal edge detection means comprise means listed below, namely:
a) amplitude value detection means for the detection of temporally successive amplitude values of the signal,
b) rise detection means for the detection of the presence of a rise between a first detected amplitude value and a second detected amplitude value,
c) time of occurrence detection means for the detection of signal edge occurrence information representing the time of occurrence of a signal edge,
d) signal strength value detection means for the detection of a signal strength value by means of at least one of the detected amplitude values,
e), signal strength value assessment means for the assessment of the detected signal strength value in relation to a signal strength reference value.

To achieve the above-mentioned object, features according to the invention are provided for signal edge detection means according to the invention, so that signal edge detection means according to the invention may be characterized in the following way, namely:

Signal edge detection means for detecting a signal edge in a signal with temporally successive signal edges, which signal edge detection means comprise means listed below, namely:
a) amplitude value detection means for the detection of temporally successive amplitude values of the signal,
b) rise detection means for the detection of a rise between a first detected amplitude value and a second detected amplitude value,
c) time of occurrence detection means for the detection of signal edge occurrence information representing the time of occurrence of a signal edge,
d) signal strength value detection means for the detection of a signal strength value by means of at least one of the detected amplitude values,
e) signal strength value assessment means for the assessment of the detected signal strength value in relation to a signal strength reference value.

By providing the features according to the invention, an improved method and an improved communication station and improved signal edge detection means are obtained in a simple way and using both a hard-wired logic circuit and a programmable circuit, wherein a very important improvement consists in the fact that, with the method according to the invention, an improvement in interference susceptibility is achieved with regard to the detection of signal edges in a data signal. An advantage is achieved for example in particular in the case of RFID data transmission systems, in which a modulated data signal is output by a data signal transmission means made by the so-called polymer-IC technique, wherein the modulated data signal is then output in relatively weak form, whereby only a relatively noisy demodulated data signal arises in a communication station receiving the modulated data signal after demodulation of this data signal but problem-free data communication with the communication station is nonetheless always ensured by the provision of the measures according to the invention, since, by means of the measures according to the invention, problem-free detection of signal edges of the demodulated data signal is ensured despite the relatively weak modulated data signal and the relatively noisy demodulated data signal. A particular advantage of the method according to the invention is obtained when interference pulses or spikes occur, i.e. a superimposed interference signal occurs, in a signal with temporally successive signal edges, i.e. a conventional wanted signal, since in this case in particular detection of the wanted signal edges proceeds correctly.

In the case of a method according to the invention, it has proven particularly advantageous for the features as claimed in claim 2 or claim 3 or claim 4 to be additionally provided, since in all of these cases a signal strength value is obtained relatively simply and sufficiently precisely.

It has moreover proven advantageous, in connection with the above-described measures according to the invention, for the features as claimed in claim 5 or claim 6 to be additionally provided. These measures known per se are particularly advantageous in the context of the present invention.

The above-stated aspects of the invention and further aspects thereof emerge from the example of embodiment described below and are explained with reference to this example of embodiment.

The invention will be further described with reference to an example of embodiment shown in the drawings, to which, however, the invention is not restricted.

Figure 1:
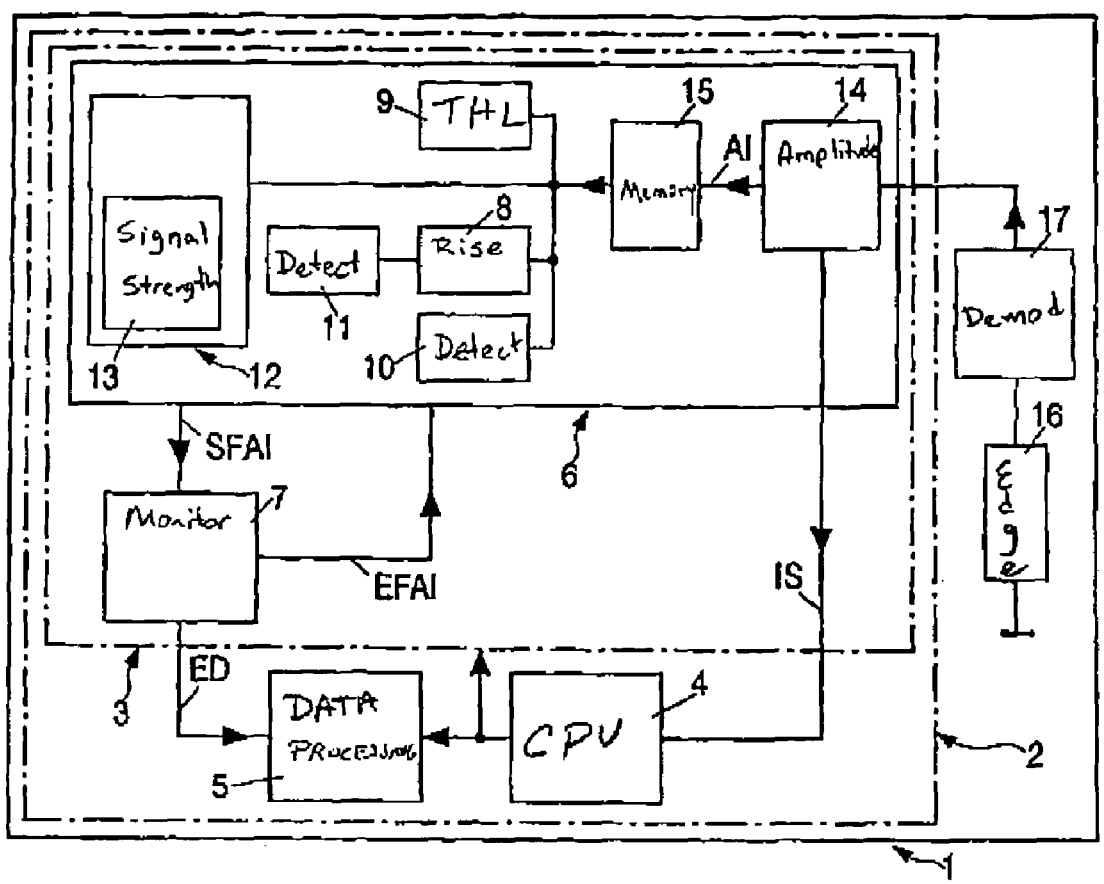
FIG. 1 is a schematic representation, in the form of a block diagram, of a portion, essential in the present context, of a communication station and of signal edge detection means according to an example of embodiment of the invention.

FIG. 1 shows a communication station 1. The communication station 1 comprises a station circuit 2, which in the present instance takes the form of a microcomputer. It should be mentioned that the station circuit 2 may also take the form of a hard-wired logic circuit. The station circuit 2 comprises a central processing unit (CPU) 4 and further components which are not shown but which are required for standard operation of a microcomputer, together with station data processing means 5, which station data processing means 5 are controlled by the central processing unit (CPU) 4.

The station circuit 2 further comprises data rate detection means 3, which data rate detection means 3 are likewise controlled by the central processing unit (CPU) 4 and are provided for performing data rate detection. The data rate detection means 3 comprise signal edge detection means 6, which are designed to detect signal edges, and in this case rising signal edges, and to generate signal edge occurrence information SFAI. It should be mentioned that such signal edge detection means 6 are also designed to detect falling signal edges, as will become obvious from the remainder of the description. In addition, monitoring means 7 are contained in the data rate detection means 3, to which monitoring means 7 the signal edge occurrence information SFAI is fed and which monitoring means 7 are designed to monitor signal edge times of occurrence within given limits. Signal edge expected-time window information EFAI may be fed by the monitoring means 7 to the signal edge detection means 6. The data rate detection means 3 are further designed to output detected data ED to the station data processing means 5.

The signal edge detection means 6 contain memory means 15, to which memory means 15 amplitude value information AI is fed and which memory means 15 are designed to store amplitude value information. The memory means 15 may also be memory means 15 which are external relative to the signal edge detection means 6. Downstream of the memory means 15 are connected rise detection means 8, which are designed to detect the presence of a rise of a signal edge, and threshold detection means 9, which are provided for calculating amplitude thresholds +THL and −THL, and time of occurrence detection means 10, which are designed to detect signal edge occurrence information SFAI, and signal strength value detection means 12, which are designed to detect a signal strength value. Signal strength value assessment means 13 are contained in the signal strength value detection means 12, which signal strength value assessment means 13 are designed to assess a signal strength value. Downstream of the rise detection means 8 are connected direction detection means 11, which direction detection means 11 are designed to detect signal edge direction information.

The communication station 1 is in the present case a component of an asynchronous data transmission system and is in this respect designed for contactless communication with at least one data carrier, not described here. This contactless communication may proceed for example at least in part to ISO standard 14443. To this end, the communication station 1 further comprises transmit/receive means 16 for transmitting and receiving data signals respectively to and from at least one data carrier and demodulation means 17, which demodulation means 17 are connected with the transmit/receive means 16 and designed to demodulate the signal supplied by the transmit/receive means 16. The means required for transmitting operation are not shown, due to their irrelevance in the present context. In the case of the present communication station 1, the transmit/receive means 16 are designed respectively to transmit or receive data signals in capacitive manner. It should be mentioned that the transmit/receive means 16 may also be designed in inductive manner for transmission or reception. A demodulated data signal obtained by means of the demodulation means 17 and which occurs in the above-mentioned asynchronous data transmission system, in which asynchronous data transmission system a bit is transmitted in the form of a signal edge generated at a specific set time, is fed to amplitude value detection means 14, which are downstream of the demodulation means 17. The amplitude value detection means 14 are designed to detect amplitude values and to output amplitude value information AI and to output an interrupt signal IS. In the case of the communication station 1 of FIG. 1, the amplitude value detection means 14 take the form of an analog/digital converter formed with the microcomputer, which analog/digital converter outputs amplitude value information AI in the form of 10 bit-wide data with a specific sampling frequency to the memory means 15. The interrupt signal IS is formed after each analog/digital conversion performed by the analog/digital converter and fed to the central processing unit (CPUT) 4. The sampling frequency or sampling rate is in the present case ten thousand (10,000) samplings per second, which corresponds to a sampling frequency of approximately 10 samplings per transmitted bit, i.e. each in the form of a signal edge generated at a specific set time. It may be mentioned that, if desirable, the sampling frequency may be substantially higher, for example twice or three times the stated sampling frequency, or lower, for instance half the stated sampling frequency.

A sequence will now be described below, which is performed in the microcomputer and in particular in the signal edge detection means 16 after activation by the central processing unit (CPU) 4 on the basis of an interrupt signal IS. By way of explanation, reference should here be made to FIG. 2, which FIG. 2 shows detected amplitude values M1, M2, M3, M4, M5, which are in each case separated from one another by a sampling time interval ts, together with the amplitude threshold +THL and an interpolation curve EL and a signal edge time of occurrence SFA and a correction value K.

Reference should in principle be made to the fact that the described sequence may proceed repeatedly and in succession and that, during the sequence, variables assume assigned values, which assigned values may maintain their validity in a following sequence.

Figure 2:
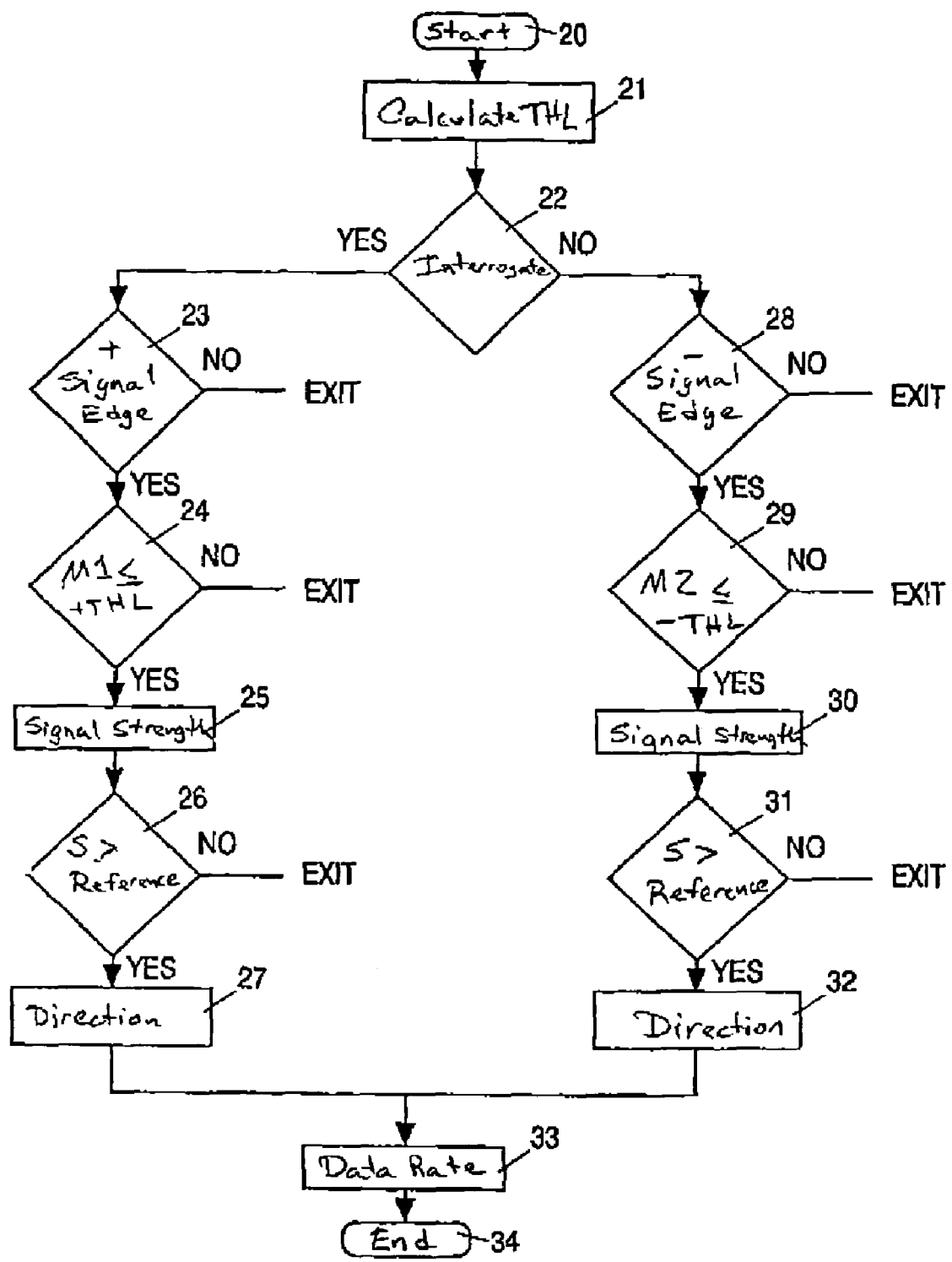
FIG. 2 shows a flow chart of a routine, which is performed in the communication station as shown in FIG. 1 when a method according to the invention is implemented.

As is clear from FIG. 2, the sequence is begun at a block 20. Calculation of the amplitude threshold +THL then proceeds at a block 21 by means of the threshold detection means 9. In the present case, an envelope curve of the demodulated data signal is used for calculation of the amplitude threshold +THL. More precisely, the amplitude threshold +THL is formed from half the difference between a maximum envelope curve value and a minimum envelope curve value. It may be mentioned that the amplitude threshold +THL may also be formed by other values, but this is known in expert circles and will not for this reason be examined in any more detail here. After the block 21, an interrogation is performed at a block 22 as to whether a positive or a negative signal edge is to be detected, by interrogating a NEXTEDGE variable for a POS value. If the result of the interrogation at block 22 is positive (YES), the sequence is continued at a block 23, i.e. is branched for signal edge detection of a positive signal edge by means of the signal edge detection means 6. If the result is negative (NO), the sequence continues at block 28, i.e. is branched for signal edge detection of a negative signal edge.

At block 23, an interrogation is performed by means of the rise detection means 8 as to whether the amplitude value M2 detected by means of the amplitude value detection means 14 and stored in the memory means 15 is greater than or equal to the amplitude threshold +THL. If the result of the interrogation at block 23 is positive (YES), the sequence is continued at a block 24, whereas, if the result is negative (NO), the sequence is broken off, i.e. a new interrupt signal is awaited. At the block 24, an interrogation is performed by means of the rise detection means 8 as to whether the detected amplitude value M1 is lower than the amplitude threshold +THL. If the result of the interrogation at block 24 is positive (YES), the sequence is continued at a block 25, whereas, if the result is negative (NO), the sequence is again broken off. At the block 25, a calculation of a signal strength value S from the detected amplitude values M2, M3, M4 and M5 is effected by means of the signal strength value detection means 12 and on the basis of the equation $$S = M2 + M3 + M4 + M5 \quad (1)$$

Figure 3:
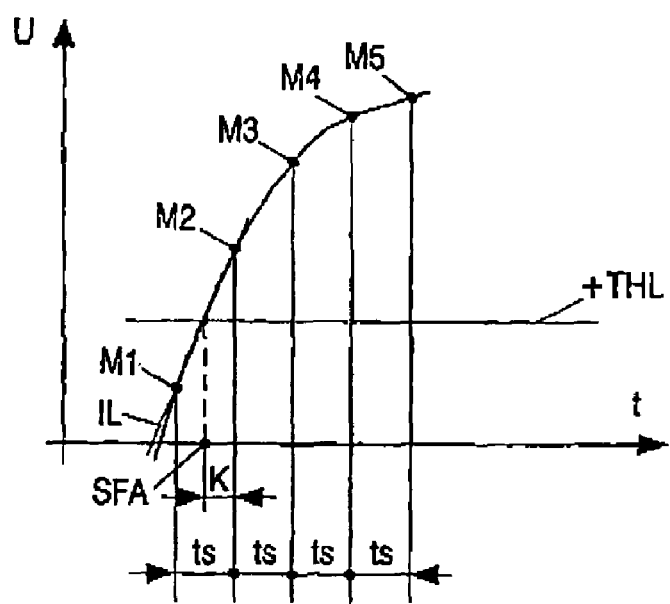
FIG. 3 is a schematic representation of a portion of a data signal occurring in the communication station according to FIG. 1 and the information obtained therefrom.

It may be mentioned that for calculation of the signal strength value S, it is also possible to use fewer detected amplitude values, for example only the detected amplitude values M2 and M3, or indeed if necessary more detected amplitude values, for example in addition to the detected amplitude values M2, M3, M4 and M5, further detected amplitude values which are not shown but which would be designed in FIG. 3 with reference numerals M6 and M7. It should additionally be mentioned that the signal strength value S may be formed from the differences between the detected amplitude values used for calculation and the amplitude threshold +THL, for example in accordance with the following equation:

$$S = [M2 - (+THL)] + [M3 - (+THL)] \quad (2)$$

In the present case, after block 25 a check is performed at a block 26, by means of the signal strength value assessment means 13, as to whether the signal strength value S is greater than a signal strength reference value, wherein in the present case the signal strength reference value amounts to four times the amplitude threshold +THL. Express reference should be made to the fact that the signal strength reference value may also assume other values, for example five times or twice the amplitude threshold +THL, wherein this may depend also on how strong interference amplitudes are in comparison to the signal amplitudes, and how steep an expected signal edge is in comparison with interference variations in relation to the sampling rate. If the result of the interrogation at block 26 is positive (YES), the sequence is continued at a block 27, whereas, if the result is negative (NO), the sequence is again broken off. At the block 27, signal edge direction information is formed by means of the direction detection means 11. In the present case, the signal edge direction information is formed in that the NEXTEDGE variable is set to a NEG value, thereby causing a negative signal edge to be detected during a rerun of the sequence, wherein the sequence is then continued at a block 28. At the block 27, calculation of the signal edge time of occurrence SFA additionally is additionally effected by means of the time of occurrence detection means 10, as shown in FIG. 3. To this end, a correction value K is calculated as follows from a linear interpolation between the detected amplitude value M1 and the detected amplitude value M2 separated by the sampling time interval ts:

$$K = \frac{(M2 - (+THL)) * ts}{(M2 - M1)} \quad (3)$$

It may be mentioned that the correction value K may also be detected in a different manner, for example by performing other interpolation methods, as known in specialist circles and therefore not examined in any more detail here. After the block 27, the sequence is continued at a block 33, which will be examined in more detail below.

In the case of signal edge detection of a negative signal edge by means of the signal edge detection means 6, as described below, reference should once again be made to FIG. 3, wherein the assumption should be made that the ordinate illustrated represents a negative direction and a portion of a negative signal edge is thus illustrated. At the above-mentioned block 28, an interrogation is now performed as to whether the amplitude value M2 detected by means of the amplitude value detection means 14 and stored in the memory means 15 is lower than or equal to a negative amplitude threshold −THL, wherein the negative amplitude threshold −THL is in this case equal in value to the positive amplitude threshold +THL. If the result of the interrogation at block 28 is positive (YES), the sequence is continued at a block 29, whereas, if the result is negative (NO), the sequence is broken off, i.e. a new interrupt signal is awaited. At the block 29, an interrogation is performed as to whether the detected amplitude value M1 is greater than the negative amplitude threshold −THL. If the result of the interrogation at block 29 is positive (YES), the sequence is continued at a block 30, whereas, if the result is negative (NO), the sequence is again broken off. At the block 30, a calculation of a signal strength value S from the detected amplitude values M2, M3, M4 and M5 is effected, as in the case of signal edge detection of a positive signal edge, on the basis of the equation:

$$S = M2 + M3 + M4 + M5 \quad (4)$$

Thereafter, a check is performed at a block 31, by means of the signal strength value detection means 12, as to whether the signal strength value S is greater than a signal strength reference value, wherein in the present case the signal strength reference value amounts to four times the amplitude threshold −THL. Reference should at this point again be made to the fact that the signal strength reference value may also assume other values, as was mentioned with reference to signal edge detection of a positive signal edge. If the result of the interrogation at block 31 is positive (YES), the sequence is continued at a block 32, whereas, if the result is negative (NO), the sequence is again broken off. At the block 32, signal edge direction information is again obtained by means of the direction detection means 11 in such a way that the NEXTEDGE variable is set to a POS value, thereby causing a positive signal edge to be detected during a rerun of the sequence. At the block 32, calculation of the signal edge time of occurrence SFA is additionally effected by means of the time of occurrence detection means 10. To this end, a correction value K is calculated as follows from a linear interpolation between the detected amplitude value M1 and the detected amplitude value M2 separated by the sampling time interval ts:

$$K = \frac{(M2 + (-THL)) * ts}{(M2 - M1)} \quad (5)$$

After the block 27, the sequence is continued at a block 33. In the block 33, data rate detection proceeds as described in the as yet unpublished European patent application bearing application no. 01 890 214.8 and bearing the applicant's reference PHAT010044 EP-P, wherein the previously detected signal edge time of occurrence SFA required for the sequence described here is forwarded. After the block 33, the sequence is finally completed at a block 34.

It may be mentioned that the rise detection means 8 may also contain rise assessment means, with which rise assessment means a rise may be assessed with regard to the rise value thereof. The provision of such rise assessment means offers the advantage that signal edges with too slight a degree of rise may be simply eliminated thereby, such that such signal edges do not undergo any detection process.

It should additionally be mentioned that, in the case of a modification of the above-described sequence, the signal edge expected-time window information EFAI, which defines a time window and which may be generated by means of the monitoring means and output by the monitoring means 7, is used in the communication station 1 according to FIG. 1 to allow detection of signal edges only in the time window defined by this information EFAI. By this measure, the detection reliability in the case of a method according to the invention is additionally improved.

The invention claimed is:

1. A method of detecting a signal edge in a signal with temporally successive signal edges, the method comprising:
   a) detection of temporally successive amplitude values of the signal,
   b) detection of the presence of a rise between a first detected amplitude value and a second detected amplitude value,
   c) detection of signal edge occurrence information representing the time of occurrence of a signal edge,
   d) detection of a signal strength value by means of at least one of the detected amplitude values,
   e) assessment of the detected signal strength value in relation to a signal strength reference value.

2. A method as claimed in claim 1, in which the signal strength value is obtained from the absolute value of the difference between the at least one detected amplitude value and an amplitude threshold for the signal.

3. A method as claimed in claim 1, in which the signal strength value is detected by means of least one amplitude value lying outside a time period between the first detected amplitude value and he second detected amplitude value.

4. A method as claimed in claim 1, in which the signal strength value is detected by sum formation from at least one of the first detected amplitude value and the second detected amplitude value and at least one further amplitude value.

5. A method as claimed in claim 4, in which an assessment of the detected rise with regard to its rise value in relation to a rise threshold is performed and in which detection of signal edge direction information representing the direction of a signal edge is performed, in which positive signal edge direction information is formed if the first amplitude value is lower than the amplitude threshold and the second amplitude value occurs after the first detected amplitude value and is greater than the amplitude threshold and if the sum of the difference between the second detected amplitude value and the amplitude threshold and at least a further difference between a further amplitude value subsequent to the second detected amplitude value and the amplitude threshold is greater than the signal strength reference value.

6. A method as claimed in claim 4, in which an interpolation curve is set between the first detected amplitude value and the second detected amplitude value and in which the signal edge occurrence information is determined by means of the amplitude value, coinciding with the amplitude threshold, of the interpolation curve.

7. A communication station with signal edge detection means for detecting a signal edge in a signal with temporally successive signal edges, which signal edge detection means comprises:
   a) amplitude value detection means for the detection of temporally successive amplitude values of the signal,
   b) rise detection means for the detection of the presence of a rise between a first detected amplitude value and a second detected amplitude value,
   c) time of occurrence detection means for the detection of signal edge occurrence information representing the time of occurrence of a signal edge,
   d) signal strength value detection means for the detection of a signal strength value by means of at least one of the detected amplitude values, e) signal strength value assessment means for the assessment of the detected signal strength value in relation to a signal strength reference value.

8. Signal edge detection means for detecting a signal edge in a signal with temporally successive signal edges, which signal edge detection means comprises:
  a) amplitude value detection means for the detection of temporally successive amplitude values of the signal,
  b) rise detection means for the detection of a rise between a first detected amplitude value and a second detected amplitude value,
  c) time of occurrence detection means for the detection of signal edge occurrence information representing the time of occurrence of a signal edge,
  d) signal strength value detection means for the detection of a signal strength value by means of at least one of the detected amplitude values,
  e) signal strength value assessment means for the assessment of the detected signal strength value in relation to a signal strength reference value.

* * * * *